United States Patent
Wei et al.

(10) Patent No.: US 9,387,647 B2
(45) Date of Patent: Jul. 12, 2016

(54) ELECTRONIC DEVICE AND DUST COVER THEREOF

(71) Applicant: Cho-Yi Lin, New Taipei (TW)

(72) Inventors: Hong-Fan Wei, Taipei (TW); I-Chin Lin, Taipei (TW); Cho-Yi Lin, New Taipei (TW)

(73) Assignee: Shenzhen China Star Optoelectronics Technology Co., Ltd., Guangming District of Shenzhen, Guangdong (CN)

( * ) Notice: Subject to any disclaimer, the term of this patent is extended or adjusted under 35 U.S.C. 154(b) by 146 days.

(21) Appl. No.: 14/026,584

(22) Filed: Sep. 13, 2013

(65) Prior Publication Data

US 2014/0218877 A1 Aug. 7, 2014

(30) Foreign Application Priority Data

Feb. 1, 2013 (TW) .............................. 102202335 U

(51) Int. Cl.
*B32B 7/02* (2006.01)
*H04B 1/3816* (2015.01)

(52) U.S. Cl.
CPC ............... *B32B 7/02* (2013.01); *H04B 1/3816* (2013.01); *Y10T 428/24008* (2015.01); *Y10T 428/24331* (2015.01); *Y10T 428/24942* (2015.01)

(58) Field of Classification Search
CPC .............. G06K 7/0021; G06K 7/0069; G06K 13/0831; G06K 13/08; G06K 13/0806; H01R 13/6335; H04B 1/3816
USPC .............................................. 361/752
See application file for complete search history.

(56) References Cited

U.S. PATENT DOCUMENTS

| | | | | |
|---|---|---|---|---|
| 4,170,104 A | * | 10/1979 | Yamagata ............... | G04C 3/001 200/302.2 |
| 6,148,183 A | * | 11/2000 | Higdon et al. ............. | 455/575.1 |
| 7,489,522 B2 | | 2/2009 | Hoshino | |
| 7,573,719 B2 | | 8/2009 | Allcock | |
| 8,253,046 B2 | * | 8/2012 | Chen et al. .................... | 200/5 A |
| 8,824,153 B2 | | 9/2014 | Chang | |
| 8,926,345 B2 | * | 1/2015 | Kim et al. ..................... | 439/142 |
| 2006/0073848 A1 | * | 4/2006 | Kwon .......................... | 455/558 |
| 2006/0231619 A1 | * | 10/2006 | Lee .............................. | 235/441 |
| 2006/0274511 A1 | * | 12/2006 | Choi ............................ | 361/754 |
| 2007/0227864 A1 | * | 10/2007 | Tsai ............................. | 200/293 |
| 2008/0096606 A1 | * | 4/2008 | Park et al. .................... | 455/558 |

(Continued)

FOREIGN PATENT DOCUMENTS

WO    WO 2012149806 A1  * 11/2012

*Primary Examiner* — Adrian S Wilson
*Assistant Examiner* — Abhishek Rathod
(74) *Attorney, Agent, or Firm* — Winston Hsu; Scott Margo

(57) ABSTRACT

An electronic device includes a case having an opening, an electronic circuit and a dust cover. The electronic circuit is disposed in the case and includes a circuit board, a switch, and an expansion card slot. The switch and the expansion card slot are electrically connected at the circuit board. The opening exposes the switch and the expansion card slot. The expansion card slot includes an electrical connector used for electrical connection with an expansion card. The dust cover is detachably disposed at the opening. The dust cover includes a cap portion, a press portion and an elastic portion. The cap portion closes the opening. The press portion faces the switch. The elastic portion is respectively connected to the cap portion and the press portion, so the press portion is capable of moving relative to the cap portion and hence has a trigger position and a release position.

11 Claims, 7 Drawing Sheets

(56) References Cited

U.S. PATENT DOCUMENTS

| | | | |
|---|---|---|---|
| 2011/0228493 A1* | 9/2011 | Liang | H01H 13/705 361/752 |
| 2011/0255252 A1 | 10/2011 | Sloey | |
| 2012/0026656 A1* | 2/2012 | Lee et al. | 361/679.01 |
| 2012/0050962 A1* | 3/2012 | Hsiung | 361/679.01 |
| 2012/0162925 A1* | 6/2012 | Luo et al. | 361/727 |
| 2012/0224330 A1* | 9/2012 | Liu et al. | 361/726 |
| 2012/0325634 A1* | 12/2012 | Yang et al. | 200/341 |
| 2013/0026340 A1* | 1/2013 | Kanamori et al. | 250/200 |
| 2013/0114225 A1* | 5/2013 | Schack et al. | 361/781 |
| 2013/0334948 A1* | 12/2013 | Chung et al. | 312/333 |
| 2014/0247568 A1 | 9/2014 | Lin et al. | |

* cited by examiner

ELECTRONIC DEVICE AND DUST COVER THEREOF

This non-provisional application claims priority under 35 U.S.C. §119(a) on Patent Application No(s). 102202335 filed in Taiwan, R.O.C. on Feb. 1, 2013, the entire contents of which are hereby incorporated by reference.

BACKGROUND

1. Technical Field

The disclosure relates to an electronic device and a dust cover thereof, more particularly to an electronic device having an expansion card slot and a dust cover thereof.

2. Related Art

As time goes on, in order to save materials and be portable, electronic devices are developing to be lighter, thinner, and smaller in size and weight. Besides, users have a strong demand for more functions of the electronic devices. Therefore, electronic device providers utilize expansion components so that electronic components have expanded functions.

In addition, some functions of the electronic device need assistance from other industries to work. For example, when communication need to be performed on an electronic device, communication associated industries need to have related communication function worked. Some industries provide expansion units vice versa. With expansion unit installed on the electronic device, electronic device perform functions variously.

However, the button design and design of expansion components in the electronic device usually occupy internal space of the electronic device, which make the goal of lighter and thinner design of the electronic device difficult to reach.

SUMMARY

An electronic device comprises a case, an electronic circuit and a dust cover. The case has an opening. The electronic circuit is disposed in the case. The electronic circuit comprises a circuit board, a switch, and an expansion card slot. The switch and the expansion card slot are electrically connected at the circuit board. The opening exposes the switch and the expansion card slot. The expansion card slot comprises an electrical connector configured for electrical connection with an expansion card. The dust cover is detachably disposed at the opening. The dust cover comprises a cap portion, a press portion and an elastic portion. The cap portion closes the opening. The press portion faces the switch. The elastic portion is respectively connected to the cap portion and the press portion, so that the press portion is capable of moving relative to the cap portion and hence has a trigger position and a release position. When the press portion is at the trigger position, the press portion presses against the switch so as to trigger a signal. When the press portion is at the release position, the press portion is kept a distance from the switch, and the elastic portion makes the press portion at the release position in a normal state.

Moreover, a dust cover comprises a cap portion, a press portion and an elastic portion. The elastic portion is located at a periphery of the press portion. The elastic portion is respectively connected to the cap portion and the press portion. Elasticity of the elastic portion is greater than that of the press portion, so that the press portion is capable of being displaced from the cap portion.

BRIEF DESCRIPTION OF THE DRAWINGS

The disclosure will become more fully understood from the detailed description given herein below for illustration only, and thus does not limit the present disclosure, wherein.

DETAILED DESCRIPTION

Figure 1A:
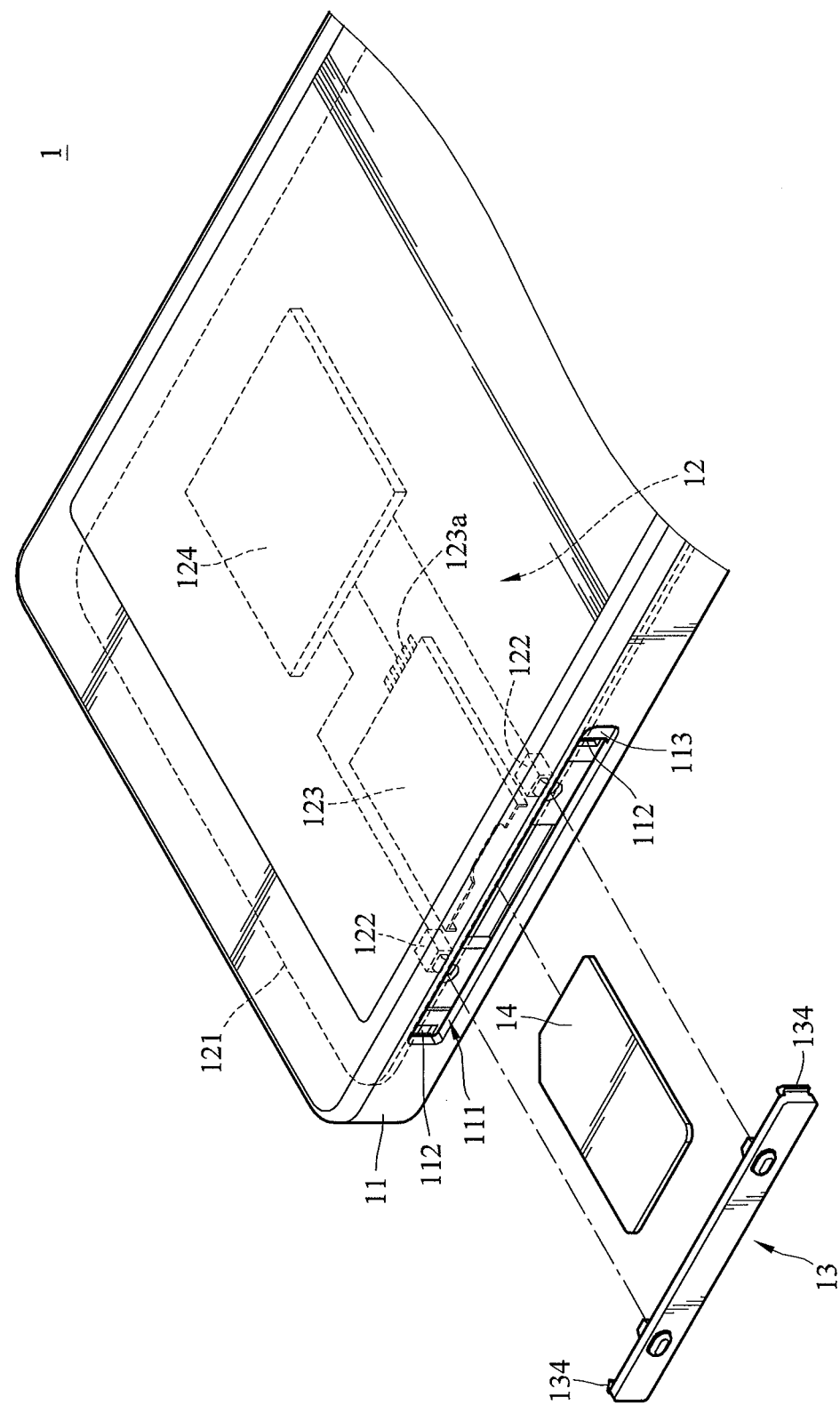
FIG. 1A is a perspective exploded view of an electronic device according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
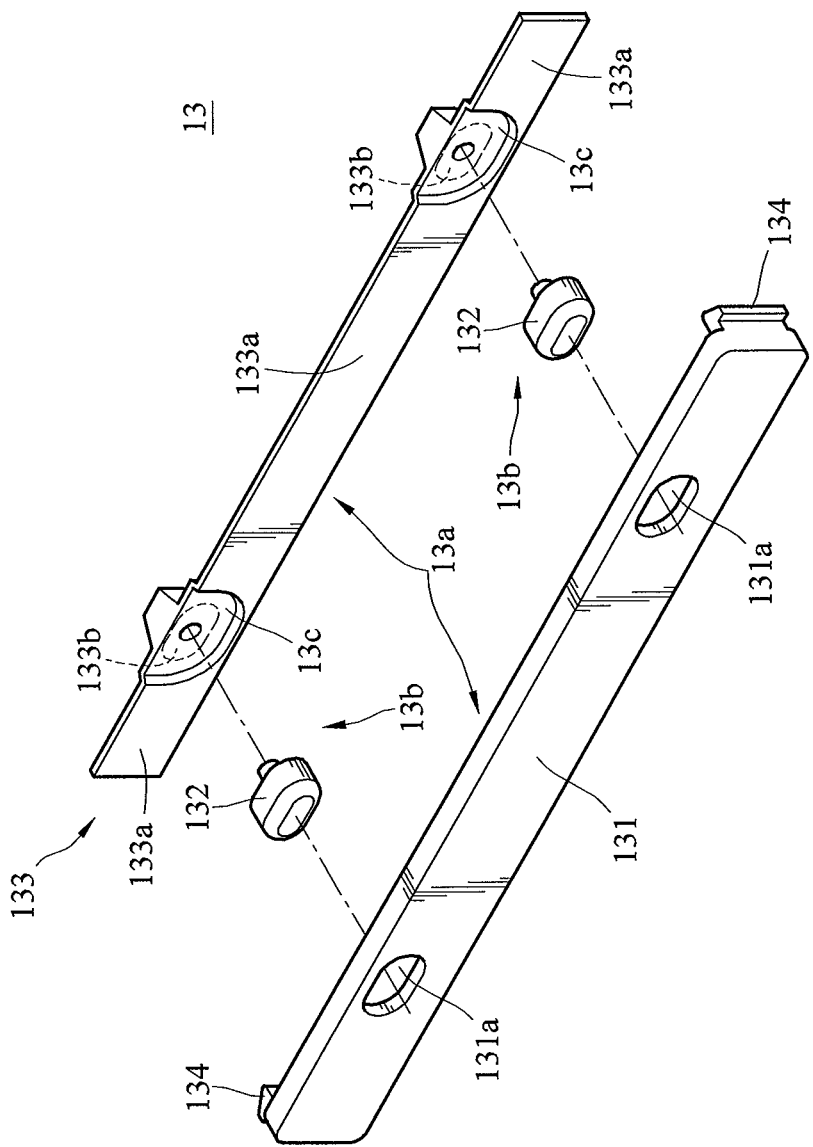
FIG. 1B is a perspective exploded view of the dust cover in FIG. 1A.

Referring to FIG. 1A and FIG. 1B, FIG. 1A is a perspective exploded view of an electronic device 1 according to an embodiment of the disclosure, and FIG. 1B is a perspective exploded view of a dust cover 13 in FIG. 1A. The electronic device 1 of the disclosure comprises a case 11, an electronic circuit 12, and a dust cover 13. The case 11 has an opening 111, two second buckling portions 112 and a groove portion 113. The second buckling portions 112 are located at two opposite sides of the opening 111. The groove portion 113 is adjacent to one of the second buckling portions 112. The electronic circuit 12 is disposed in the case 11. The electronic circuit 12 comprises a circuit board 121, a plurality of switches 122, an expansion card slot 123 and a processor 124. The switch 122, the expansion card slot 123 and the processor 124 are electrically connected at the circuit board 121, and the opening 111 exposes the switch 122 and the expansion card slot 123. The expansion card slot 123 comprises an electrical connector 123a. The electrical connector 123a is used for electrical connection with an expansion card 14. The dust cover 13 is disposed at the opening 111 in a detachable manner.

The dust cover 13 comprises a cap portion 13a, a plurality of press portions 13b, an elastic portion 13c and two first buckling portions 134. The cap portion 13a closes the opening 111. The press portions 13b face the switch 122. The elastic portion 13c is located at a periphery of the press portions 13b. The elastic portion 13c is respectively connected to the cap portion 13a and the press portions 13b. Elasticity of the elastic portion 13c is greater than that of the press portions 13b, that is, an elastic modulus of the elastic portion 13c is smaller than that of the press portions 13b, so that the press portions 13b are capable of displacement relative to the cap portion 13a.

In detail, the dust cover 13 comprises a plate body 131, a plurality of buttons 132 and an elastic body 133. The elastic body 133 comprises a first connection portion 133a and a plurality of second connection portions 133b that keep a distance from each other. The elastic portion 13c is located at the elastic body 133, and is located between the first connection portion 133a and the second connection portions 133b. The plate body 131 has a through hole 131a. The plate body 131 is adhered to the first connection portion 133a, and the through hole 131a overlaps a part of the second connection portions 133b, so that the plate body 131 and the first connection portion 133a form the cap portion 13a. The second connection portions 133b keep a distance from the cap portion 13a. The buttons 132 are located at the through hole 131a, and are adhered to the second connection portions 133b, so that the buttons 132 and the second connection portions 133b form the press portions 13b. The press portions 13b are capable of displacement relative to the cap portion 13a by means of an elastic force of the elastic portion 13c.

The first buckling portions 134 are respectively connected at two opposite sides of the plate body 131. The first buckling portions 134 are buckled at the second buckling portions 112 in a detachable manner. The elastic portion 13c enables the press portions 13b to move relative to the cap portion 13a and hence have a trigger position and a release position. When the press portions 13b are at the trigger position, the press portions 13b press against the switch 122 so as to trigger a signal. When the press portions 13b are at the release position, the press portions 13b keep a distance from the switch 122. In a normal state, the elastic portion 13c makes the press portions 13b at the release position.

When the expansion card 14 needs to be inserted into the expansion card slot 123 or the expansion card 14 needs to be taken out of the expansion card slot 123, a user can push the dust cover 13 from the groove portion 113, so that the first buckling portions 134 and the second buckling portions 112 are separated, thereby enabling the dust cover 13 to be separated from the opening 111 of the case 11, so as to expose the expansion card slot 123. At this time, the user can insert the expansion card 14 into the expansion card slot 123 through the opening 111, or take the expansion card 14 out of the expansion card slot 123. After finishing the above actions, the user can place the dust cover 13 at the case 11. The dust cover 13 can be disposed at the opening 111 of the case 11 through buckling between the first buckling portions 134 and the second buckling portions 112. At this time, the user can press the press portions 13b against the switch 122 so as to trigger a signal.

Figure 1C:
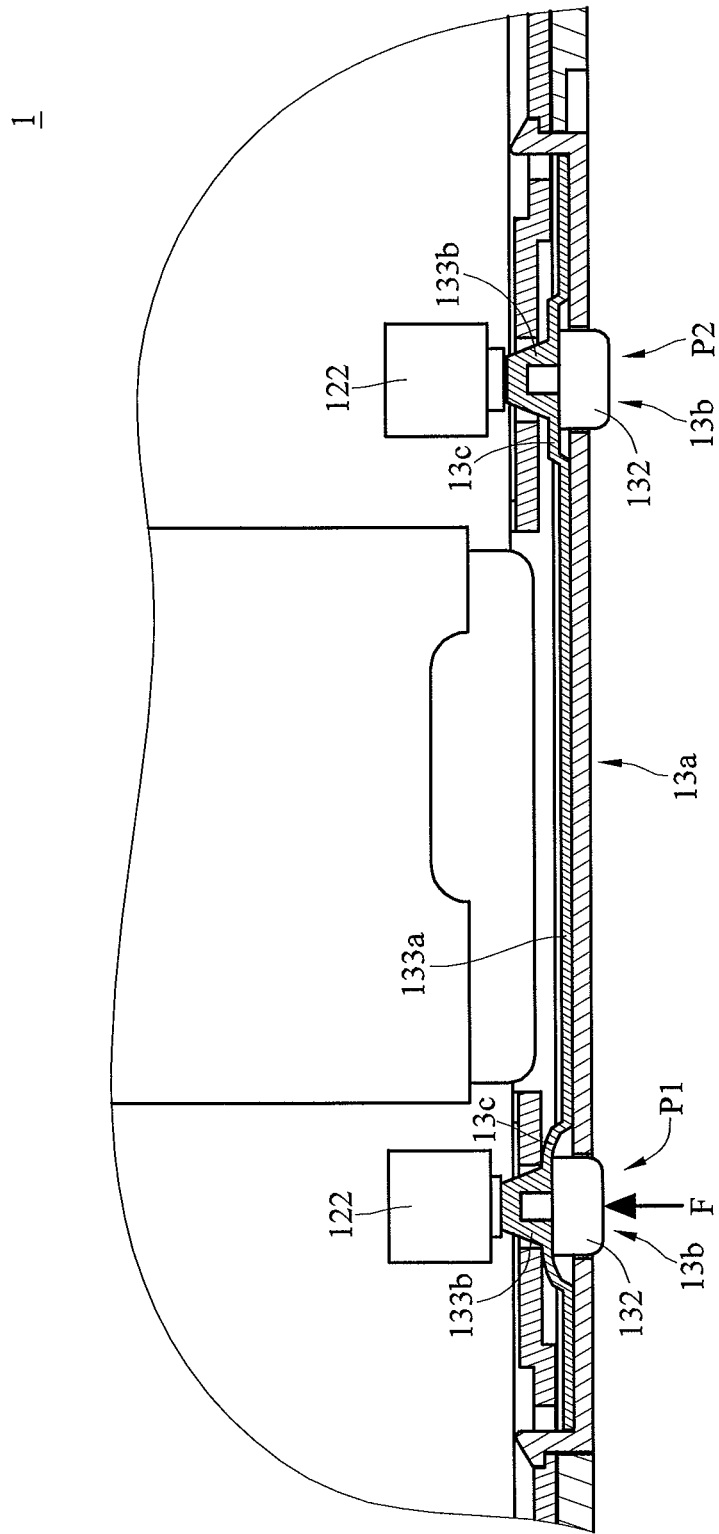
FIG. 1C is a sectional view of the electronic device in FIG. 1A.

Referring to FIG. 1C, FIG. 1C is a sectional view of the electronic device 1 in FIG. 1A. In FIG. 1C, the left part represents that the press portions 13b is at a trigger position P1. An external force F pushes the button 132 of the press portion 13b to move towards the switch 122. The button 132 pushes the second connection portion 133b of the press portion 13b to move towards the switch 122, thereby deforming the elastic portion 13c. The second connection portion 133b presses against the switch 122 so as to trigger a signal, so that the press portion 13b is at the trigger position P1, while the cap portion 13a remains unchanged.

In FIG. 1C, the right part represents that the press portion 13b is at a release position P2. When the external force F is released, the elastic portion 13c, by means of an elastic resilience generated due to the previous deformation, pushes the button 132 and the second connection portion 133b of the press portion 13b away from the switch 122, making the second connection portion 133b keep a distance from the switch 122, so that the press portion 13b is at the release position P2. Besides, in a normal state, the elastic portion 13c makes the press portion 13b at the release position P2.

Figure 2:
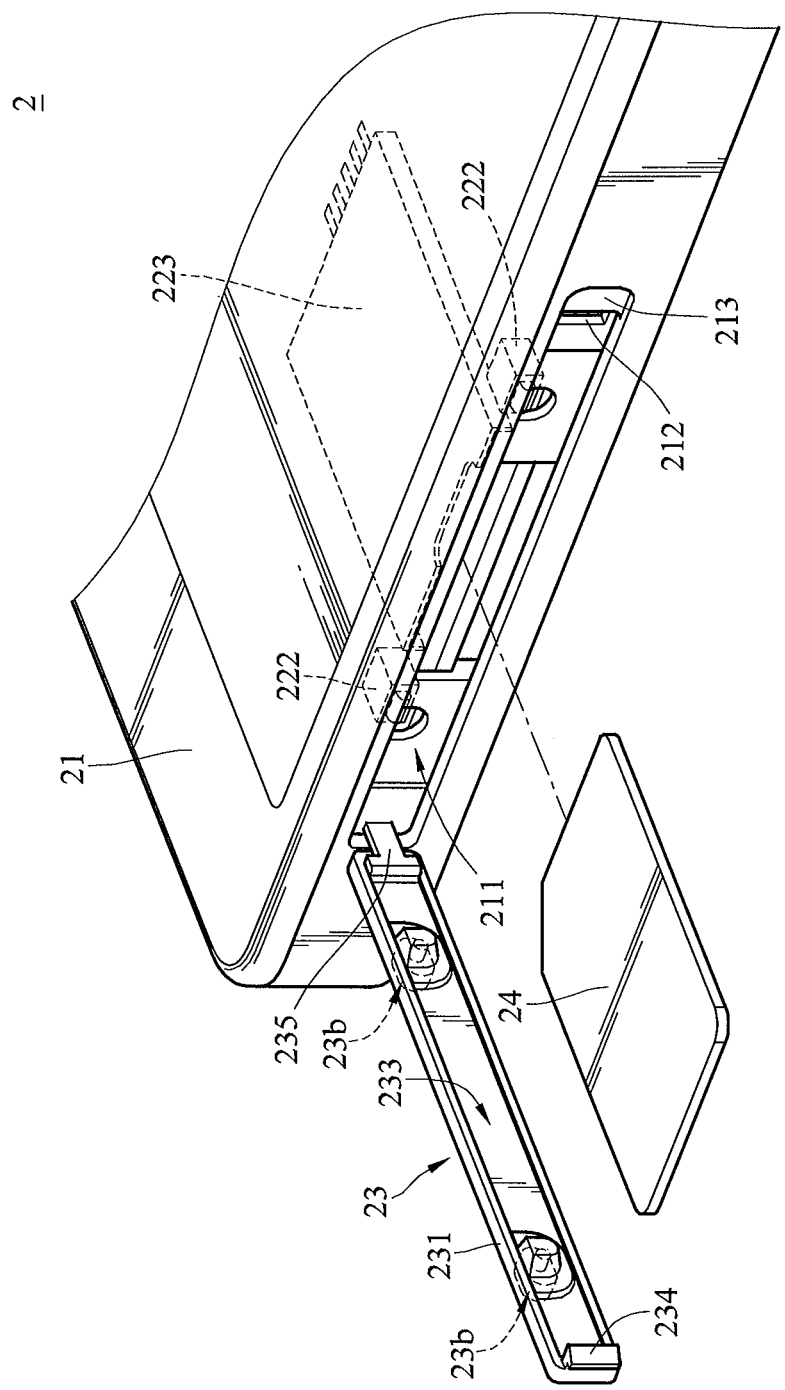
FIG. 2 is a perspective exploded view of an electronic device according to another embodiment of the disclosure.

Referring to FIG. 2, FIG. 2 is a perspective exploded view of an electronic device 2 according to another embodiment of the disclosure. The electronic device 2 is similar to the electronic device 1 shown in FIG. 1A. However, in this embodiment, a dust cover 23 only comprises one first buckling portion 234. The first buckling portion 234 is connected to one side of the plate body 231. An end of the elastic body 233 away from the first buckling portion 234 is connected at a case 21. The elastic body 233 can be connected at the case 21 through rubber 235. The case 21 only comprises one second buckling portion 212. The second buckling portion 212 is located at one side of the opening 211. The first buckling portion 234 is buckled at the second buckling portion 212 in a detachable manner. The case 21 further comprises a groove portion 213, and the groove portion 213 is adjacent to the second buckling portion 212.

When an expansion card 24 needs to be inserted into an expansion card slot 223 or the expansion card 24 needs to be taken out of the expansion card slot 223, a user can push the dust cover 23 from the groove portion 213, so that the first buckling portion 234 and the second buckling portion 212 are separated, enabling the dust cover 23 to rotate away from the opening 211 of the case 21. At this time, the opening 211 is capable of exposing the expansion card slot 223. However, the end of the elastic body 233 away from the first buckling portion 234 is still connected to the case 21. At this time, the user can insert the expansion card 24 into the expansion card slot 223 through the opening 211, or take the expansion card 24 out of the expansion card slot 223. After finishing the above actions, the user can rotate the dust cover 23 back to the case 21. The dust cover 23 is disposed at the opening 211 of the case 21 through buckling between the first buckling portion 234 and the second buckling portion 212. At this time, the user can press the press portion 23b against the switch 222 so as to trigger a signal.

Figure 3:
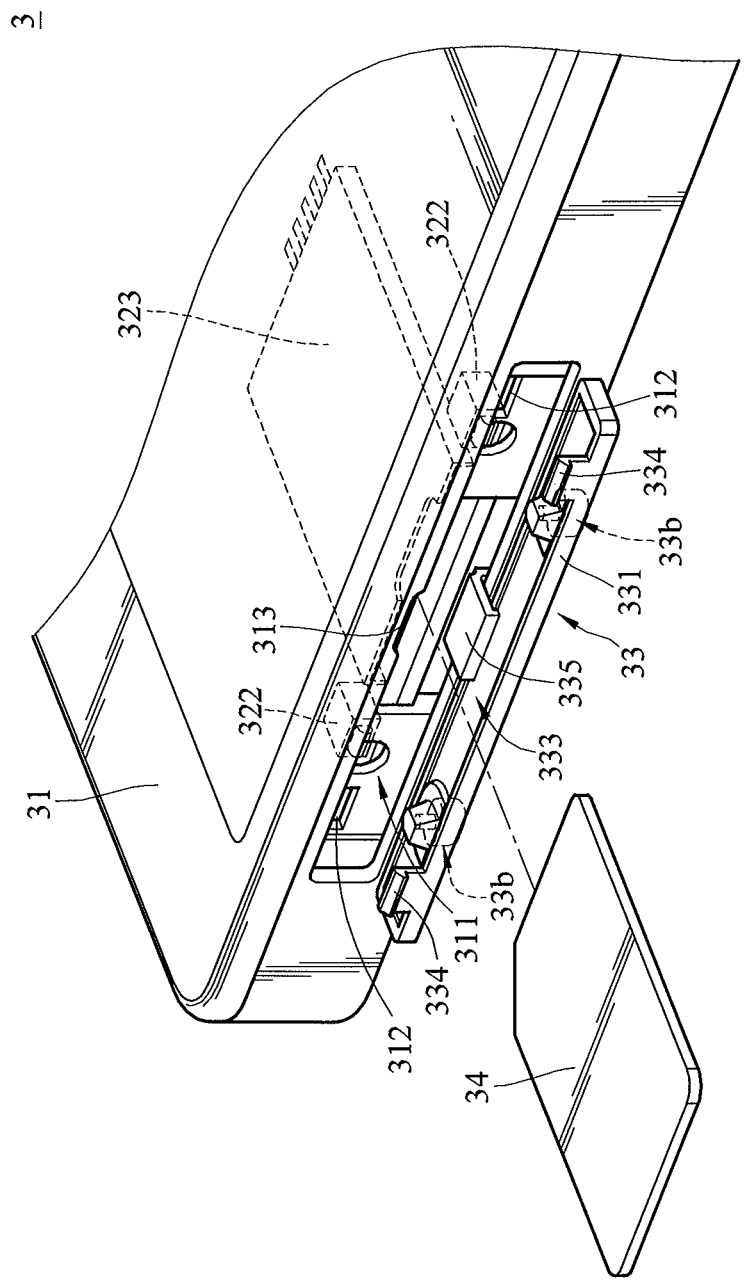
FIG. 3 is a perspective exploded view of an electronic device according to another embodiment of the disclosure.

Referring to FIG. 3, FIG. 3 is a perspective exploded view of an electronic device 3 according to another embodiment of the disclosure. The electronic device 3 is similar to the electronic device 1 shown in FIG. 1A. However, in this embodiment, a dust cover 33 comprises a plurality of first buckling portions 334. The first buckling portions 334 are connected to the same side of a plate body 331. An end of an elastic body 333 away from the first buckling portions 334 is connected to a case 31. An elastic body 333 can be connected at the case 31 through rubber 335. The case 31 comprises a plurality of second buckling portions 312. The second buckling portions 312 are located at the same side of the opening 311. The first buckling portions 334 are buckled at the second buckling portions 312 in a detachable manner. The case 31 further comprises a groove portion 313. The groove portion 313 is adjacent to the opening 311 and is close to the second buckling portions 312.

When the expansion card 34 needs to be inserted into the expansion card slot 323 or the expansion card 34 needs to be taken out of the expansion card slot 323, a user can push the dust cover 33 from the groove portion 313, so that the first buckling portions 334 and the second buckling portions 312 are separated, enabling the dust cover 33 to rotate away from the opening 111 of the case 31. At this time, the opening 311 exposes the expansion card slot 323. However, the end of the elastic body 333 away from the first buckling portions 334 is still connected to the case 31. At this time, the user can insert the expansion card 34 into the expansion card slot 323 through the opening 311, or take the expansion card 34 out of the expansion card slot 323. After finishing the above actions, the user can rotate the dust cover 33 back to the case 31. The dust cover 33 is disposed at the opening 311 of the case 31 through buckling between the first buckling portions 334 and the second buckling portions 312. At this time, the user can press the press portion 33b against the switch 322 so as to trigger a signal.

Figure 4:
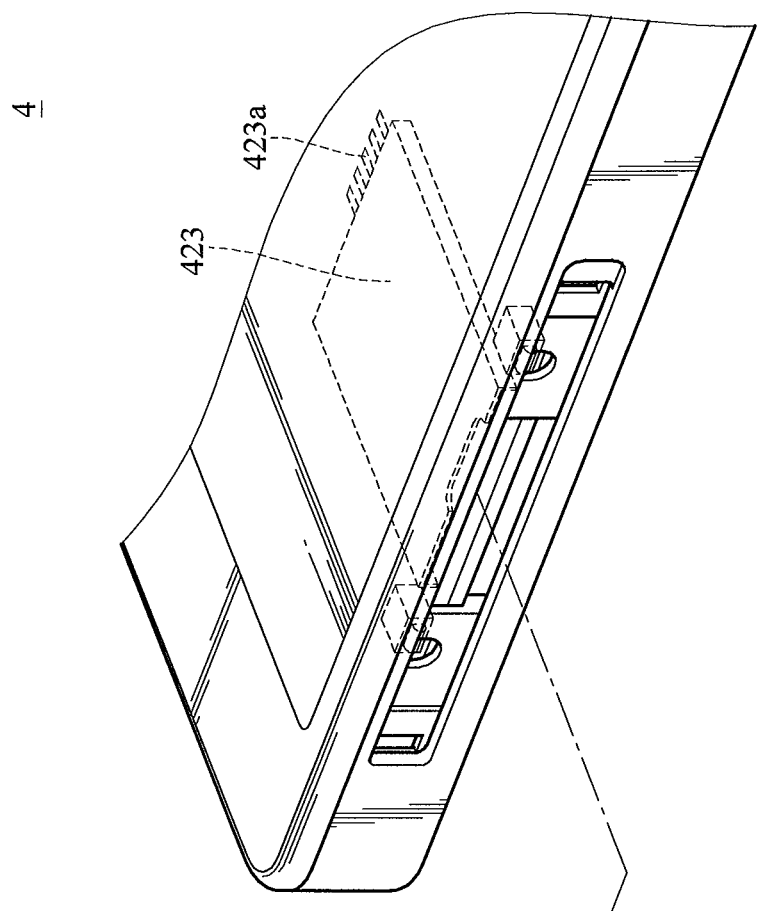
FIG. 4 is a perspective exploded view of an electronic device according to another embodiment of the disclosure.
Figure 4:
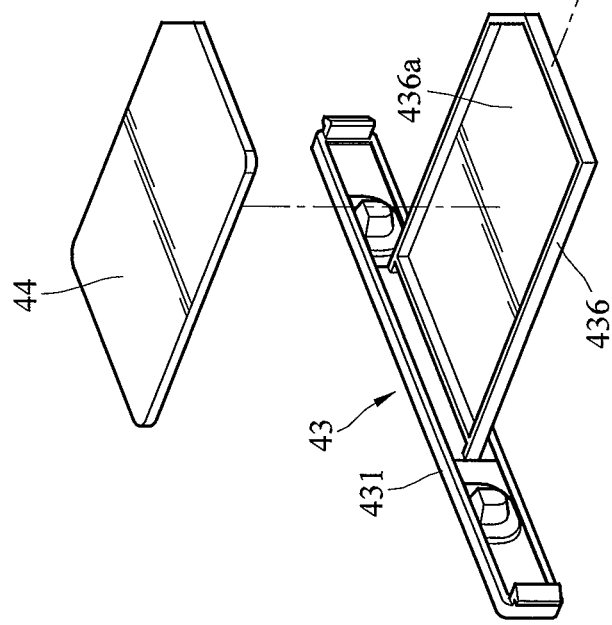

Referring to FIG. 4, FIG. 4 is a perspective exploded view of an electronic device 4 according to another embodiment of the disclosure. The electronic device 4 is similar to the electronic device 1 shown in FIG. 1A. However, in this embodiment, a dust cover 43 further comprises a bearing tray 436 connected at the plate body 431. The bearing tray 436 has an accommodating groove 436a. The accommodating groove 436a is used for placing an expansion card 44. The bearing tray 436 is inserted in the expansion card slot 423 in a detachable manner, so that the expansion card 44 is electrically connected to an electrical connector 423a of the expansion card slot 423.

Figure 5:
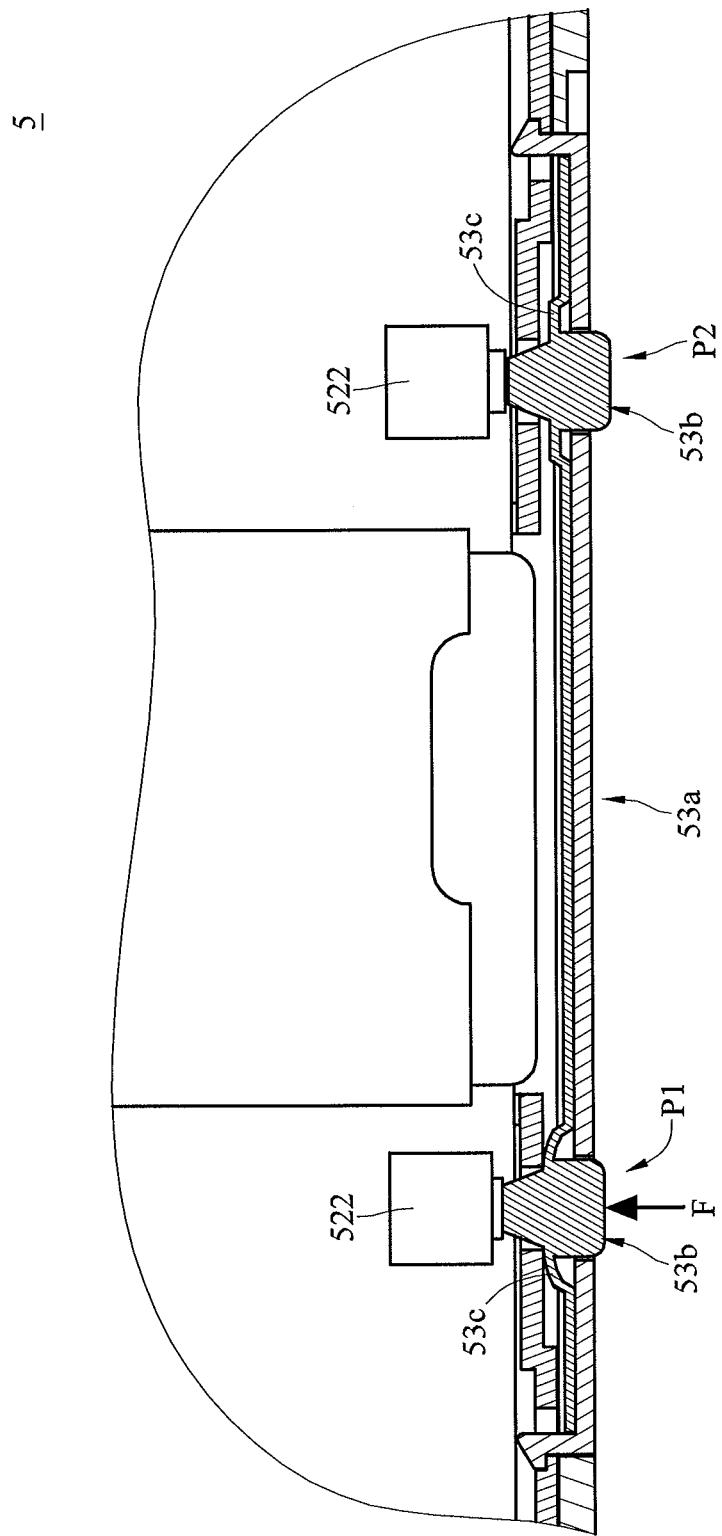
FIG. 5 is a sectional view of an electronic device according to another embodiment of the disclosure.

Referring to FIG. 5, FIG. 5 is a sectional view of an electronic device 5 according to another embodiment of the disclosure. The electronic device 5 is similar to the electronic device 1 shown in FIG. 1C. However, in this embodiment, a press portion 53b is integrally formed in an undetachable manner. In FIG. 5, the left part represents that the press portion 53b is at a trigger position P1. An external force F pushes the press portion 53b to move towards a switch 522, thereby deforming the elastic portion 53c. The press portion 53b presses against the switch 522 so as to trigger a signal, so that the press portion 53b is at the trigger position P1, while the cap portion 53a remains unchanged.

In FIG. 5, the right part represents that the press portion 53b is at a release position P2. When the external force F is released, the elastic portion 53, by means of an elastic resilience generated due to the previous deformation, pushes the press portion 53b away from the switch 522, making the press portion 53b keep a distance from the switch 522, so that the press portion 53b is at the release position P2. Besides, in a normal state, the elastic portion 53c makes the press portion 53b at the release position P2.

To sum up, in the electronic device and the dust cover thereof according to the disclosure, the switch and the expansion card slot are disposed in an opening, so that the press portion and the expansion card slot are put together. The dust cover disposed at the opening prevents foreign substances such as dust from entering the expansion card slot. Additionally, at the trigger position, the press portion disposed at the dust cover can press against the switch so as to trigger a signal. Therefore, the space occupied by the switch and the expansion card slot in the electronic device is concentrated and reduced as compared with when these components are distributed in the electronic device. Thereby a waste of space is avoided. The elastic portion can be connected at the case through rubber, so as to prevent the dust cover from being lost when the dust cover is open to expose the opening. The bearing tray assists in inserting the expansion card into the expansion card slot smoothly, preventing the expansion card from being damaged as the expansion card is not aligned when being inserted.

What is claimed is:

1. An electronic device, comprising:
   a case having an opening;
   an electronic circuit disposed in the case, the electronic circuit comprising a circuit board, a switch, and an expansion card slot, the switch and the expansion card slot being electrically connected at the circuit board, and the opening exposing the switch and the expansion card slot, the expansion card slot comprising an electrical connector configured for electrical connection with an expansion card; and
   a dust cover detachably disposed at the opening, the dust cover comprising a cap portion, a press portion, an elastic portion, an elastic body, a plate body, and a button, the cap portion closing the opening, the press portion facing the switch, the elastic body comprising a first connection portion and a second connection portion, wherein the second connection portion is concaved from the first connection portion to form a receiving room receiving a front portion of the press portion, the second connection portion is so configured that the first connection portion and the second connection portion are kept a distance from each other along a moving direction of the press portion, the elastic portion is located at the elastic body and is between the first connection portion and the second connection portion, the elastic portion being located at a periphery of the press portion, and the elastic portion being respectively connected to the cap portion and the press portion, so that the press portion is capable of moving relative to the cap portion and hence has a trigger position and a release position, wherein when the press portion is at the trigger position, the press portion presses against the switch so as to trigger a signal, and when the press portion is at the release position, the press portion is kept a distance from the switch, and the elastic portion makes the press portion at the release position in a normal state;
   wherein the plate body has a through hole, the plate body is adhered to the first connection portion, and the through hole overlaps a part of the second connection portion so that the plate body and the first connection portion form the cap portion, the button is located at the through hole, and is adhered to the second connection portion, so that the button and the second connection portion form the press portion, and the press portion is capable of being displaced relative to the cap portion by an elastic force of the elastic portion, and the elastic portion and the elastic body are integrally formed with the same elastic material.

2. The electronic device according to claim 1, wherein the second connection portion keeps a distance from the cap portion.

3. The electronic device according to claim 1, wherein the dust cover further comprises a bearing tray connected with the plate body, the bearing tray has an accommodating groove, and the accommodating groove is configured for placing the expansion card, the bearing tray is inserted in the expansion card slot in a detachable manner, so that the expansion card is electrically connected to the electrical connector of the expansion card slot.

4. The electronic device according to claim 3, wherein the second connection portion keeps a distance from the cap portion.

5. The electronic device according to claim 1, wherein the dust cover further comprises two first buckling portions, the two first buckling portions are respectively connected at two opposite sides of the plate body, the case further comprises two second buckling portions, the two second buckling portions are located at two opposite sides of the opening, and the two first buckling portions are buckled at the two second buckling portions in a detachable manner.

6. The electronic device according to claim 5, wherein the second connection portion keeps a distance from the cap portion.

7. The electronic device according to claim 5, wherein the case further comprises a groove portion, and the groove portion is adjacent to one of the two second buckling portions.

8. The electronic device according to claim 7, wherein the second connection portion keeps a distance from the cap portion.

9. The electronic device according to claim 1, wherein the dust cover further comprises at least one first buckling portion, the first buckling portion is connected to one side of the plate body, an end of the elastic body away from the first buckling portion is connected at the case, the case further comprises at least one second buckling portion, and the first buckling portion is buckled at the second buckling portion in a detachable manner.

10. A dust cover, comprising a cap portion, a press portion, an elastic portion, an elastic body, and a plate body having a through hole, the elastic portion being located at a periphery of the press portion, the elastic portion being respectively connected to the cap portion and the press portion, and elasticity of the elastic portion being greater than that of the press portion, so that the press portion is capable of being displaced relative to the cap portion, and the elastic body comprises a first connection portion and a second connection portion, wherein the second connection portion is concaved from the first connection portion to form a receiving room receiving a front portion of the press portion, the second connection portion is so configured that the first connection portion and the second connection portion are kept a distance from each other along a moving direction of the press portion, the elastic portion is located at the elastic body and is between the first connection portion and the second connection portion, wherein the press portion and the elastic portion are located at the elastic body, the first connection portion is connected at the elastic portion, and the elastic portion is connected at the press portion, the first connection portion is adhered to the plate body, so that the first connection portion and the plate body form the cap portion, the press portion is located in the through hole, and the elastic portion is located at a periphery of the press portion, so that the press portion is capable of being displaced relative to the cap portion by means of an elastic force of the elastic portion, and the elastic portion and the elastic body are integrally formed with the same elastic material.

11. The dust cover according to claim 10, further comprising a bearing tray disposed at the plate body, the bearing tray having an accommodating groove configured for placing an expansion card.

* * * * *